(12) United States Patent
Khizroev

(10) Patent No.: US 7,969,775 B2
(45) Date of Patent: Jun. 28, 2011

(54) THREE DIMENSIONAL MAGNETIC MEMORY AND/OR RECORDING DEVICE

(75) Inventor: Sakhrat Khizroev, Coral Gables, FL (US)

(73) Assignee: The Florida International University Board of Trustees, Miami, FL (US)

( * ) Notice: Subject to any disclaimer, the term of this patent is extended or adjusted under 35 U.S.C. 154(b) by 0 days.

(21) Appl. No.: 12/726,070

(22) Filed: Mar. 17, 2010

(65) Prior Publication Data

US 2010/0172055 A1  Jul. 8, 2010

Related U.S. Application Data

(62) Division of application No. 11/197,377, filed on Aug. 4, 2005, now Pat. No. 7,706,179.

(60) Provisional application No. 60/598,645, filed on Aug. 4, 2004.

(51) Int. Cl.
*G11C 11/15* (2006.01)
(52) U.S. Cl. .......................... 365/173; 365/158; 365/171
(58) Field of Classification Search .................. 365/171, 365/173, 148, 158, 97; 428/336, 694–695; 360/125, 135
See application file for complete search history.

(56) References Cited

U.S. PATENT DOCUMENTS

| | | | |
|---|---|---|---|
| 5,103,422 A | 4/1992 | Tokita et al. | |
| 5,185,716 A | 2/1993 | Mehdipour | |
| 5,841,611 A | 11/1998 | Sakakima et al. | |
| 6,134,089 A | 10/2000 | Barr et al. | |
| 6,483,672 B1 | 11/2002 | Arnett et al. | |
| 6,513,228 B1 | 2/2003 | Khizroev et al. | |
| 6,531,202 B1 | 3/2003 | Litvinov et al. | |
| 6,646,827 B1 | 11/2003 | Khizroev et al. | |
| 6,667,848 B1 | 12/2003 | Khizroev et al. | |
| 6,713,830 B2 | 3/2004 | Nishimura et al. | |
| 6,890,667 B1 | 5/2005 | Lairson et al. | |
| 6,903,400 B2 | 6/2005 | Kikuchi et al. | |
| 7,057,865 B1 | 6/2006 | Mao et al. | |
| 7,097,924 B2 | 8/2006 | Haginoya et al. | |
| 7,144,641 B2 | 12/2006 | Kawano et al. | |
| 7,706,179 B2 * | 4/2010 | Khizroev ...................... 365/173 |
| 2004/0009375 A1 | 1/2004 | Tanahashi et al. | |
| 2006/0093865 A1 | 5/2006 | Lim et al. | |

OTHER PUBLICATIONS

Lyberatos et al., Thermal Effects in the High-Speed Switching of the Magnetizations of Fine Grains, Apr. 2003, pp. 1598-1602.
Khizroev et al., Perpendicular Magnetic Recording: Writing Process, May 1, 2004 pp. 4521-4537.
Abelmann et al., Micromagnetic Simulation of an Ultrasmall Single-Pole Perpendicular Write Head, May 1, 2000 pp. 6636-6638.
Wu et al., Magnetic Properties of Co/Pd Multilayers Sputter-Deposited at High Ar Gas Pressures, 1997 pp. 301-304.
Landau et al., On the Theory of the Dispersion of Magnetic Permeability in Ferromagnetic Bodies, Jun. 3, 1935 pp. 153-169.

* cited by examiner

*Primary Examiner* — Gene N. Auduong
(74) *Attorney, Agent, or Firm* — Marshall, Gerstein & Borun LLP

(57) ABSTRACT

An electronic memory and/or recording device includes a three dimensional magnetic medium. Three dimensional magnetic medium includes a plurality of magnetic sublayers, each of the magnetic sublayers being separated from one other by non-magnetic interlayers.

10 Claims, 4 Drawing Sheets

THREE DIMENSIONAL MAGNETIC MEMORY AND/OR RECORDING DEVICE

This application is a divisional application of and claims, for purposes of priority, the benefit of U.S. patent application Ser. No. 11/197,377, filed Aug. 4, 2005, and entitled "THREE DIMENSIONAL MAGNETIC MEMORY." U.S. patent application Ser. No. 11/197,377 claims, for the purposes of priority, the benefit of U.S. Provisional Application Ser. No. 60/598,645, filed on Aug. 4, 2004, and entitled "THREE DIMENSIONAL MAGNETIC MEMORY." Each of these applications is owned by the assignee of this application, and each of these applications is hereby expressly incorporated by reference into this application in its entirety.

BACKGROUND OF THE INVENTION

1. Field of the Invention

This invention is generally directed to electronic memory and/or recording devices, and, more particularly, to three-dimensional magnetic memory and/or recording devices.

2. Description of the Related Art

Typically, memory devices, such as volatile and non-volatile memory devices and hard drives, depend on a two-dimensional memory media configuration. However, such a configuration makes it difficult to achieve high memory densities, as it does not take advantage of space that may be available in a third dimension (i.e., thickness) of a memory device.

SUMMARY

In accordance with one aspect of the invention, an electronic memory device, includes a three dimensional magnetic medium. The three dimensional magnetic medium includes a plurality of magnetic sublayers, each of the magnetic sublayers being separated from one other by non-magnetic interlayers. The electronic memory device may further include an optional soft underlayer disposed adjacent to the three dimensional magnetic medium.

In accordance with another aspect of the invention, an electronic data recording and retrieval mechanism includes a three dimensional magnetic medium including a plurality of layers, a plurality of word/address lines adjacent to the three dimensional magnetic medium, and a large biasing wire, adapted to identify each layer of the three dimensional magnetic medium during a data recording process. The three dimensional magnetic medium includes a plurality of magnetic sublayers, each of the magnetic sublayers being separated from one other by non-magnetic interlayers.

In accordance with a still further aspect of the invention, a method of recording data on a three dimensional memory device is provided. The method includes providing a three dimensional magnetic medium, including a plurality of magnetic sublayers, each of the magnetic sublayers being separated from one other by non-magnetic interlayers, providing a plurality of word/address lines adjacent to the three dimensional magnetic medium, providing a large biasing wire, adapted to identify each layer of the three dimensional magnetic medium, driving a known electric current through the large biasing wire, and driving a set of electrical signals through the grid of word/address lines.

The invention itself, together with further objects and attendant advantages, will best be understood by reference to the following detailed description, taken in conjunction with the accompanying drawings.

DETAILED DESCRIPTION

In three-dimensional (3D) magnetic memory, information may be recorded not only on one surface of a recording medium (as in all modern two-dimensional (2D) applications) but in the entire 3D bulk of the recording medium. As a result, a substantially larger amount of data can be recorded, as compared to conventional recording systems including magnetic hard-drives, heat-assisted magnetic recording (HAMR) systems, patterned media, magnetoresistive random access memory (MRAM), and other two-dimensional systems. Moreover, 3D recording provides the ability to defer the superparamagnetic limit to substantially higher areal density compared to the limit in a 2D magnetic recording system.

Unlike other competitive technologies, the invented technology is a three-dimensional (3D) way to manipulate and store information data. Thus, the invention offers device implementations which are capable of an order of magnitude increase in the effective data densities, in comparison with the current 2D memory technologies, such as, magnetic hard-drive, CDs, DVDs, memory sticks, and others.

A 3-D memory device the size of a quarter may be capable of storing, retrieving, and recording terabytes of data, and has the potential to replace the current magnetic hard-drive and thus become the core technology in the multi-billion-dollar magnetic data storage industry. In addition, 3-D memory devices may eventually replace the current flexible storage media such as DVDs, CDs, memory sticks, and many others.

In one of the potential implementations of the proposed 3D memory technology, a memory device the size of a dime has no moving parts and may be capable of storing many gigabytes of non-volatile data. In addition, a parallel write/read mechanism makes the proposed memory device at least as fast as a semiconducting SRAM device. Similarly due to the popular flash memory in current use today, this device can be connected to a PC port or directly coupled to a USB port on a laptop, with much higher data capacity than the capacity of the best flash memory available today.

I. 3D Magnetic Media

Figure 1:
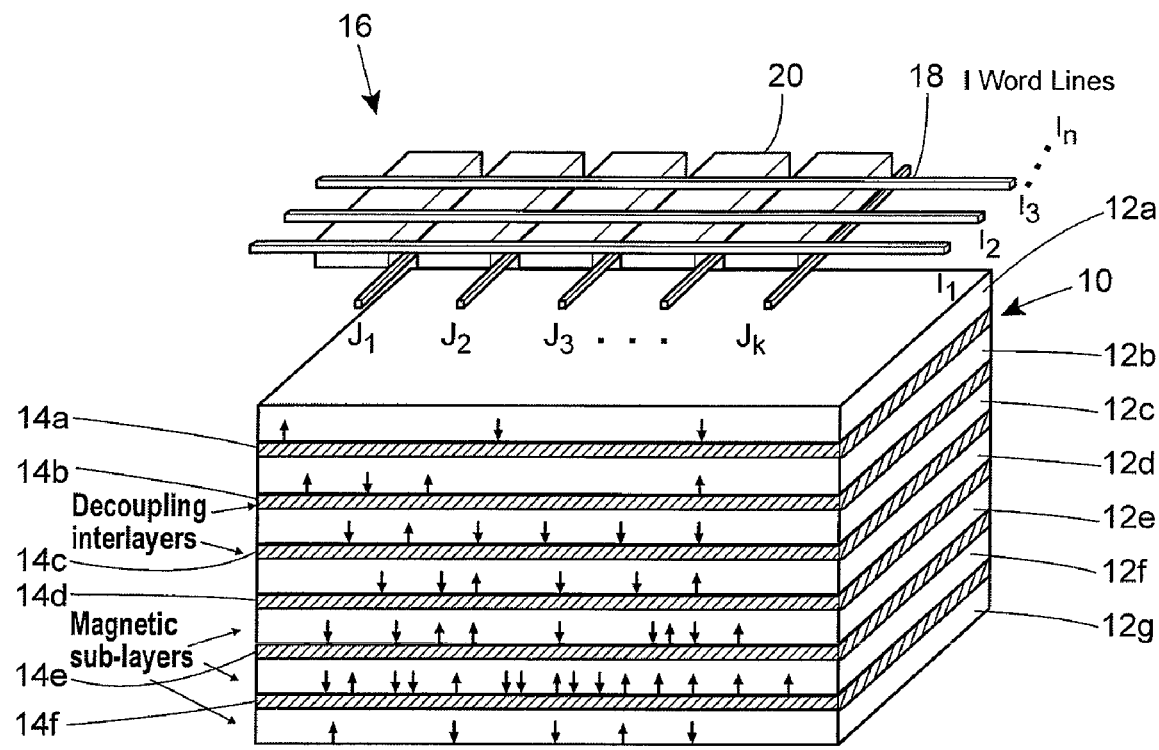
FIG. 1 is a schematic diagrams showing a structure of a 3-D magnetic medium and a grid of word/address lines, that may serve as read/write elements, near the medium.

An exemplary approach to 3D memory according to one aspect of the invention is to integrate the non-volatility of magnetic media with the benefits of parallel data recording and retrieval (readout). This produces a good data rate. As shown in FIG. 1, a 3D magnetic medium 10 may be fabricated as a stack of magnetic sublayers, 12a-12g, and each of the magnetic sublayers, 12a-12g may be separated from one another by thin non-magnetic interlayers, 14a-14f.

In each 3D magnetic medium 10, the magnetic sublayers 12a-12g and the non-magnetic interlayers 14a-14f may be approximately 10 nm and 2 nm thick, respectively. The magnetic sublayers, 12a-12g may be Co/Pt or Co/Pd perpendicular multilayers. (Note: These multilayers should not be confused with Co/Pd multilayers used in perpendicular recording.) The purpose of the non-magnetic interlayers 14a-14f is to break or decouple the quantum "exchange" coupling between adjacent magnetic sublayers 12a-12g. The non-magnetic interlayers, 14a-14f may be made from any non-magnetic material which could be deposited on the magnetic sublayers 12a-12g. For example, Pd or Pt are suitable materials for use in the non-magnetic interlayers 14a-14f, because of their well-known lattice match with magnetic Co.

Assuming that the magnetic sublayers 12a-12g have a preferred magnetization orientation perpendicular to the plane (such as in Co/Pt or other perpendicular media), the magnetization in adjacent sublayers can be directed in the opposite directions because there exists exchange coupling due the sufficiently thick "exchange" breaking interlayers 14a-14f. Otherwise, due to the "exchange" coupling all the sublayers would all have magnetization directed in the same direction.

For example, assuming there are 1000 sublayers 12a-12g, and the cross-section of each bit cell is approximately 100× 100 nm2, this type of 3D recording media could store the amount of information in the 100 terabyte-per-square-inch effective density range. This number far exceeds anything even theoretically achievable into the far future in the 2D case. For comparison, the current state-of-the-art laboratory demonstrations are in the density range of 100 Gbit/in2. It should be noted that the data capacity of less than 100 Terabits is sufficient to store the entire library of the U.S. Congress. However, it should also be remembered that in the current implementation, the effective areal density of the 3D recording system may be limited, not by the maximum capacity of the recording media, but by the recording and retrieval mechanisms.

Due to the 3D approach, the bit cell cross-section does not have to be ultra-small. In fact, no sophisticated nanofabrication tools are necessary to achieve areal density by many factors exceeding what is projected to be achieved within the next decade with 2D recording systems, such as magnetic longitudinal and perpendicular recording, patterned media, and heat-assisted magnetic recording (HAMR) using the state-of-the art fabrication tools such as E-beam and focused ion beam (FIB). In the case of 3D memory, the effective density may be achieved through the deposition of a stack of sublayers. Considering a relatively large cell size, a periodic cell pattern satisfying hundreds of gigabits-per-square-inch areal densities could be easily achieved with conventional optical lithography.

II. Data Recording and Retrieval Mechanism

A. Data Recording

No moving components are necessary for a memory system according to the invention. As further shown in FIG. 1, on top of the magnetic medium 10, a control layer 16 may be defined with a 18 of crossing word/address lines I1, 2, 3 . . . n and J1, 2, 3 . . . k, which may be made from any conducting materials, such as, for example, copper and/or aluminum. The grid 18 defines a plurality of read elements 20.

For simplicity, only recording word/address lines are shown in the diagram. There may be a separate set of lines for reading the information and parallel data recording and retrieval (readout) may be used. The information from a horizontal layer may be recorded and retrieved with one shot in case of an implementation of a memory with non moving parts. By "one shot," it is meant that the information from entire surface/layer would be recorded and retrieved simultaneously or in parallel due to the grid implementation as shown above. In contrast, if a recording write/read head flying over the medium at some finite separation, similar to the head/media design in the conventional magnetic hard drive, used, the information may be recorded and retrieved sequentially or in a "bit"-by-"bit" order (e.g., the recording head may write and read information sequentially from each bit cell across the entire thickness). The grid 18 may be similar to grids used in semiconductor RAM, such as, for example, magnetoresistive RAM, with an exception that the information is recorded and retrieved from the grid itself. In the latter case, the grid is equivalent to one magnetic layer.

Figure 2:
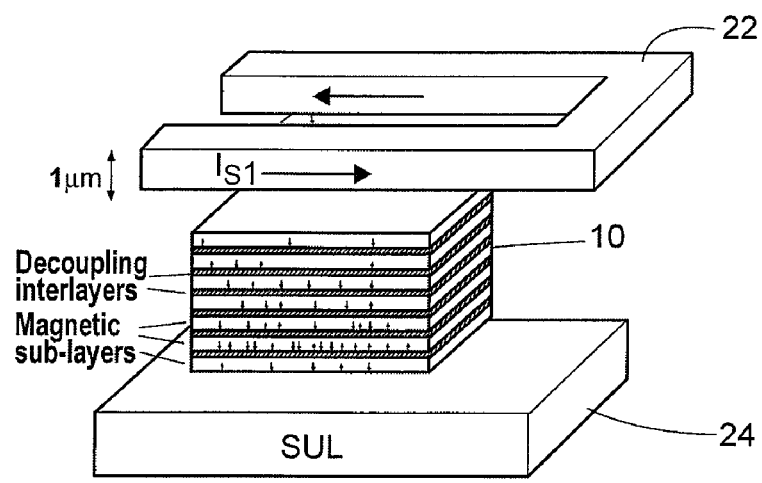
FIG. 2 is a schematic diagram showing a mechanism, including a large biasing wire, and a soft underlayer, to identify each layer of the 3-D magnetic medium, for example, during a recording process.

To identify each layer during the recording process, a certain known electric current may be driven through a relatively large metal wire 22 that may be spaced apart from the magnetic medium 10, as shown in FIG. 2. The word "wire" is not meant literally here. In fact, in practice, this "wire" could be made of coils connected in series, with each coil wrapped around a "soft" pole in each grid element. The wrapping of the coil around a soft pole is similar and has the same purpose of increasing and localizing the recording field within each bit cell. The current through the large wire 22 generates a relatively large biasing field perpendicular to the 3D magnetic medium 10. To increase the biasing field almost by a factor of two, a "soft" underlayer (SUL) 24 may be used under the 3D magnetic medium 10, as shown in FIG. 2. The material "softness" is implied in the magnetic sense (not in the physical sense), which means that the magnetization of the material is relatively easily manipulated and determined by a relatively small external field. The main purpose of the SUL 24 is to identify the layers during the reading process and will be described below. The biasing field may be varied by varying the electric current through the large wire 22.

Among the most popular "soft" magnetic materials are Permalloy (Ni 79/Fe 21 composition), iron nitrides, high-moment Fe/Co-based materials, non-conductive ferrites, and other similar materials. The thickness of the SUL should typically be larger than approximately 50 nm to guarantee the magnetic "softness."

The current range may be chosen such that the biasing field is within ten percent from the coercivity of the magnetic sublayers 12a-12g. For example, if the coercivity of the magnetic sublayers 12a-12g is 2,000 Oe, the biasing field should be approximately 1,800 Oe. The closer a sublayer is located with respect to the large wire 22, the larger the biasing field in the plane is.

Figure 3A:
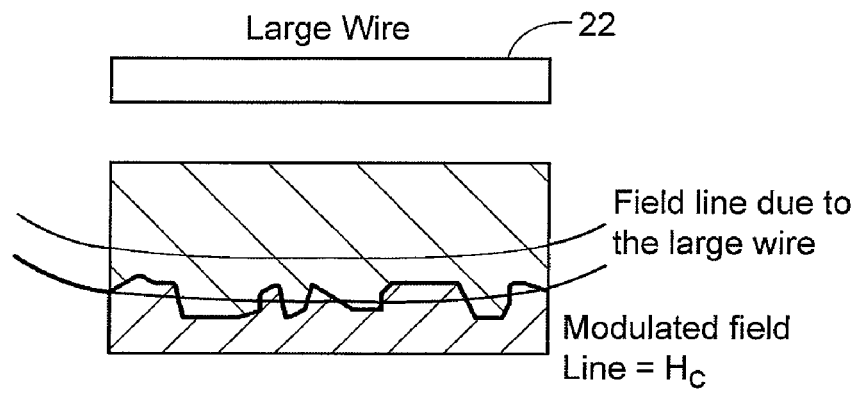
FIG. 3 is a pair of cross-sectional schematic diagrams, 3(a) and 3(b), that depict how a field generated by the large biasing wire may be used to identify individual sublayers in the 3-D medium.
Figure 3B:
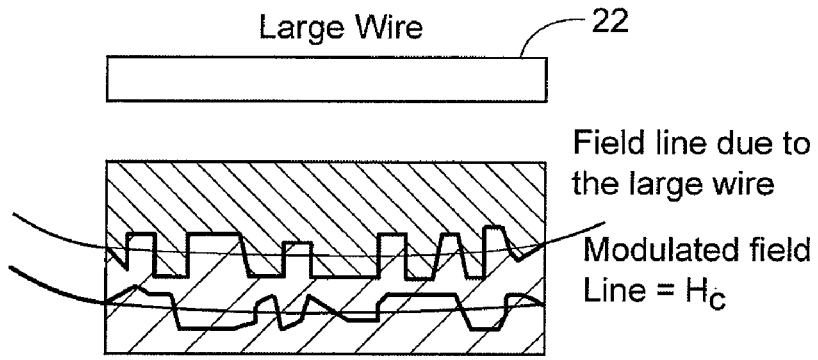

Recording of data may be produced sequentially, "layer" by "layer," as shown in FIGS. 3a and 3b These "layers" do not necessary have to coincide with the physical layers, as long as the data retrieving process uniquely matches the recording mechanism. First, the electric current may be driven to a value sufficient to generate a large field (close to the coercivity, Hc) in the vicinity of the bottom sublayer 12g (furthest from the large wire 22), as shown in FIG. 3a. Then, electric currents through the word/address lines are driven to modulate the field surface in the sublayer.

The word/address grid 18 may generate a field on the order of 300 Oe depending on the set of signals in each word/address line. Thus modulated information may be recorded in the bottom sublayer 12g. Then the current in the large wire 22 may be reduced to identify the next sublayer 12f (closer to the top surface). Another set of signals may then be driven through the word/address lines in the grid 18 to modulate the signal in this sublayer, and so on, as shown in FIG. 3b.

In FIG. 3a, the smooth solid line going through the bottom magnetic layer shows the recording field line with a value larger than the coercivity value of 8000 Oe. Such a large value of the field is necessary to "reach" the furthest (from the head) layer. The broken line shows the modulation field imposed on the biasing field. As a result of this step, certain information may be recorded in the bottom layer. FIG. 3b shows the next step in the multi-step recording process. During this step, information in the next layer (closer to the head) may be recorded. To make sure that during this step the information earlier recorded in the bottom layer is not erased, the recording field in the bottom layer may be kept smaller than the coercivity value while the field in the next level may be kept larger than the coercivity value. This could be achieved by continuously reducing the value of the current in the biasing wire. The recording field is proportional to the current and the further the field is from the source (head) the faster it drops.

In FIG. 3a, the "large" wire 22 may be implemented as a magnetic recording head in which the level of the magnetization in a certain direction may be determined by the value of the current in the drive coil. There may be several other implementations of the "large" wire 22. One possible implementation would look similar to a magnetic recording head used in a conventional hard drive.

In a relatively simple implementation, the recording across the entire thickness under each bit cell could be performed with two pulses. The first pulse would saturate ("erase") all the layers across the thickness in one of the two vertical directions. Then, the second pulse would generate the field in the opposite direction and would reverse a certain number of layers starting from the top layer. The number of the reversed layers would depend on the magnitude of the applied field. The magnitude could be continuously varied through the continuous variation of the electric current in the "large" wire 22. Thus "multi-level" information could be recorded in the same bit area.

In this relatively simple implementation, no modulation scheme described above is necessary. The advantage of this implementation is the relative simplicity. The disadvantage is the relatively inefficient use of the 3-D space compared to the more advanced mechanism (with modulation schemes) as described above. In other words, in this relatively simple implementation, each layer could not be addressed independently. Nevertheless, even this relatively simple implementation of 3-D magnetic recording is advantageous compared to the conventional recording system. In the conventional recording system, only two levels of signal are used. The two levels correspond to positively or negatively saturated media, respectively. In other words, the magnitude of the signal can have only one value (saturated) and only the polarity of the signal is varied. Even in such a relatively simple implementation, the magnitude of the signal could have more than one levels depending on the strength of the applied field during the second pulse in the above described two-pulse recording mechanism. In other words, non-saturated states of the medium could be used as other useful signal levels to store information. Therefore, the advantage of multi-level recording could be used to store more information in the same bit cell area compared to the conventional recording mechanism.

Figure 6A:
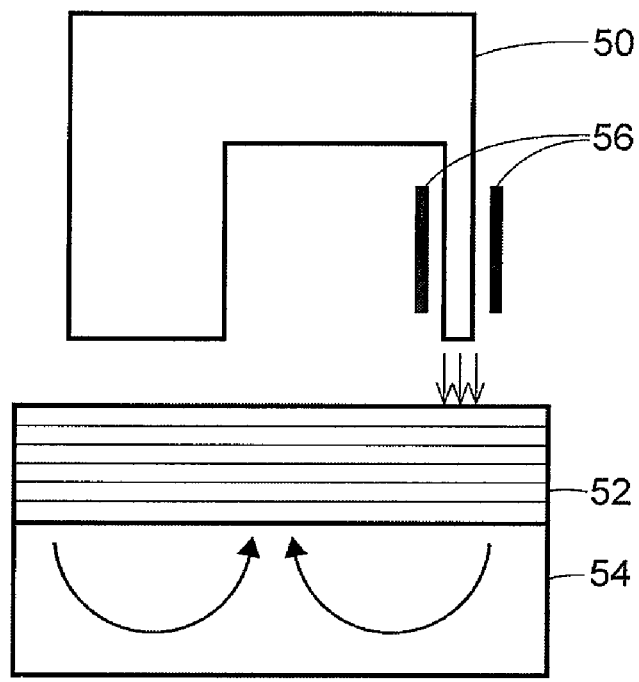
FIGS. 6a and 6b show single pole head and ring head implementations that may be used with magnetic media in accordance with the invention, with and without a soft underlayer, respectively.
Figure 6B:
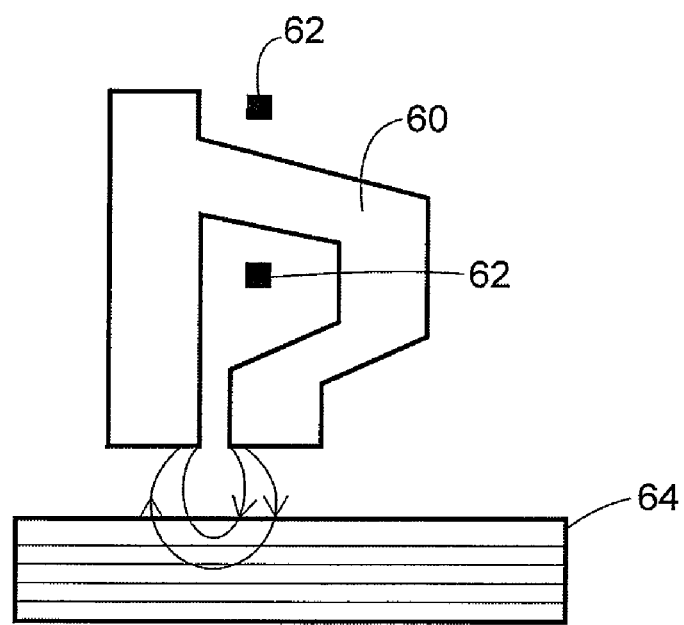

With reference to FIG. 6a, a single pole head 50 is shown flying over a 3-D magnetic storage medium 52, with an SUL 54 beneath the 3-D magnetic storage medium 52. The single pole head 50 includes a coil 56. Alternatively, as shown in FIG. 6b, a ring head 60 may be used instead, also including a coil 62, flying above a 3-D magnetic medium 64, without an SUL.

Information in the magnetic sublayers 12a-12g may be recorded sequentially, starting with the bottom layer 12g and ending with the top layer 12a.

B. Data Retrieval

Information retrieval may be produced with the application of the Reciprocity Principle. Each read element 20 includes a magnetoresistive element with a linear dependence of the resistance on the applied field. To identify each layer during the reading mechanism, the sensitivity field of each cell may be varied via a controlled variation of the "softness" of the soft underlayer (SUL) 24 on the bottom of the magnetic medium 10. Optionally, biasing of the SUL 24 may be produced by a relatively small electric current through a second biasing wire 30 associated with the SUL 24.

Figure 4:
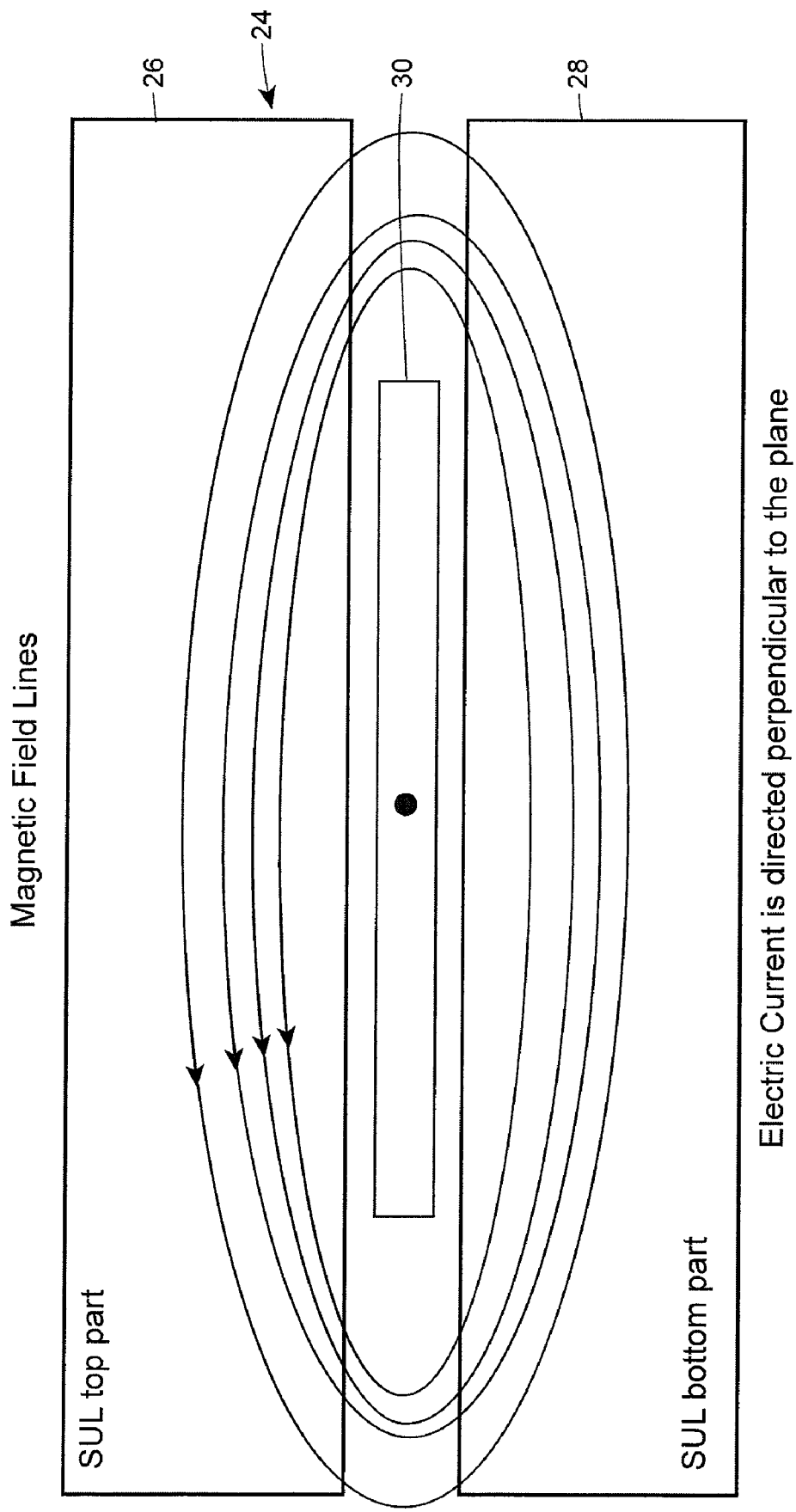
FIG. 4 is a cross-sectional schematic diagram of a soft underlayer including a second biasing wire.

A schematic diagram showing an arrangement for biasing the SUL 24 is shown in FIG. 4. The SUL 24 may include top and bottom layers 26 and 28, respectively, connected to each other magnetostatically and isolated electrically. Due to magnetostatic coupling, the top and bottom layers 26 and 28 of the SUL 24 have magnetization in the opposite directions.

The two SUL layers 26 and 28 provide a well defined "closed" path for the magnetic flux (which may be generated by the electric current in the second biasing wire 30). The schematic diagram in FIG. 4 shows the magnetic field lines generated in this SUL structure. One could see that the magnetic lines go mostly through the "soft" material of the SUL 24 thus making the biasing relatively efficient (which in turn means that less current is needed to bias the system). Due to a well defined magnetic loop around the second biasing wire 30 it takes a fairly small electric current to saturate the entire system. As a result, via a relatively small variation of the electric current through the second biasing wire 30, one can drastically change the effective permeability of the SUL 24, and consequently, drastically change the sensitivity function of each read element 20.

According to the reciprocity principle, the signal in each read element 20 is given by the following expression:

$$S \sim \int H_z(\vec{r}-\vec{r}') \cdot M_z(\vec{r}') \partial \vec{r}'$$

where Hz and Mz are the perpendicular components of the sensitivity field of the read element 20 and the magnetization in the medium, respectively. It should be noted that this convolution integration is taken over the entire volume of the 3D recording medium 10. Therefore, if the signal can be calculated in a 3D space around the 3d recording medium 10, one can obtain all the information about the magnetization (in other words, all the information stored in the 3D medium 10) as a result of deconvolution of the sensitivity field with the signal obtained as a result of the variation in the z-direction.

Figure 5:
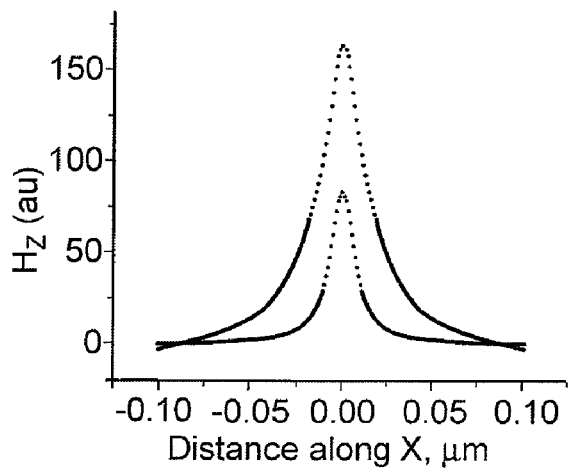
FIG. 5 depicts plots of simulated sensitivity fields for a read element.

The sensitivity field is a property of each read element 20 and the SUL 24 and can be easily calculated depending on the properties of the read element and the SUL 24. As for the signal S, each read element 20 represents a point in a 2D plane of the grid 18. Consequently, the one parameter missing is the dependence of the signal on the perpendicular direction, z. This is exactly the purpose of the earlier described control of the "softness" of the SUL 24. Earlier, it was found that as a result of the variation of the "softness" of the SUL 24, one could effectively create sufficient variation of the sensitivity field in the vertical (-Z) direction. The simulated sensitivity field for each read element with and without SUL 24 present is shown in FIG. 5. For the extreme cases of a "free" SUL 24 and a totally saturated SUL 24, the change is of the order of two.

Of course, it should be understood that a range of changes and modifications can be made to the preferred embodiments described above. It is therefore intended that the foregoing detailed description be regarded as illustrative rather than limiting and that it be understood that it is the following claims, including all equivalents, which are intended to define the scope of this invention.

What is claimed is:

1. An electronic data recording and retrieval mechanism, comprising:
   a three dimensional magnetic medium including a plurality of magnetic sublayers, wherein each magnetic sublayer is adapted for writing data to, each of the magnetic sublayers being stacked parallel to each other and separated from each other by parallel non-magnetic interlayers;
   a plurality of word/address lines disposed on a plane adjacent to the three dimensional magnetic medium, wherein the plane is parallel to the plurality of magnetic and non-magnetic layers; and
   a biasing wire separate and distinct from the plurality of word/address lines, the biasing wire adapted to identify each magnetic sublayer of the three dimensional magnetic medium during a data recording process.

2. The electronic data recording and retrieval mechanism of claim 1, further including a soft underlayer disposed adjacent to the three dimensional magnetic medium.

3. The electronic data recording and retrieval mechanism of claim 2, further including a biasing wire disposed adjacent to the soft underlayer.

4. The electronic data recording and retrieval mechanism of claim 1, wherein each magnetic sublayer is made from Co/Pt perpendicular multilayers.

5. The electronic data recording and retrieval mechanism of claim 1, wherein each magnetic sublayer is made from Co/Pd perpendicular multilayers.

6. The electronic data recording and retrieval mechanism of claim 1, further including a write/read head flying over the three dimensional magnetic medium, wherein the write/read head is separate and distinct from the biasing wire.

7. A method of recording data on a three dimensional memory device, comprising:
   providing a three dimensional magnetic medium, including a plurality of magnetic sublayers for writing data to, each of the magnetic sublayers being stacked parallel to each other and separated from one other by parallel non-magnetic interlayers;
   providing a plurality of word/address lines disposed on a plane adjacent to the three dimensional magnetic medium, wherein the plane is parallel to the plurality of magnetic and non-magnetic layers;
   providing a biasing wire separate and distinct from the plurality of word/address lines, the biasing wire adapted to identify each magnetic sublayer of the three dimensional magnetic medium;
   driving a known electric current through the biasing wire; and
   driving a set of electrical signals through the grid of word/address lines.

8. An electronic memory device, comprising:
   a three dimensional magnetic medium including a plurality of magnetic sublayers, wherein each magnetic sublayer is adapted for writing data to, wherein each of the magnetic sublayers is vertically stacked parallel to each other and separated from one another by non-magnetic interlayers, the non-magnetic interlayers parallel to one another and to the magnetic sublayers;
   a magnetically soft underlayer disposed entirely below and adjacent to the three dimensional magnetic medium such that the magnetically soft underlayer is entirely below and parallel to any magnetic sublayer or non-magnetic interlayer of the three dimensional magnetic medium; and
   a biasing wire for biasing the magnetic field of the soft underlayer;
   wherein the soft underlayer comprises a top layer and a bottom layer.

9. The electronic memory device of claim 8, wherein the biasing wire is disposed between the top layer and the bottom layer.

10. The electronic memory device of claim 8, further comprising a head floating over the three dimensional medium, wherein the head is separate and distinct from the biasing wire.

* * * * *